US007020791B1

(12) United States Patent
Aweya et al.

(10) Patent No.: US 7,020,791 B1
(45) Date of Patent: Mar. 28, 2006

(54) CLOCK RECOVERY USING A DOUBLE-EXPONENTIAL SMOOTHING PROCESS

(75) Inventors: James Aweya, Kanata (CA); Michel Ouellette, Plantagenet (CA); Delfin Y. Montuno, Kanata (CA); Kent E. Felske, Kanata (CA)

(73) Assignee: Nortel Networks Limited, Quebec (CA)

( * ) Notice: Subject to any disclaimer, the term of this patent is extended or adjusted under 35 U.S.C. 154(b) by 559 days.

(21) Appl. No.: 10/246,408

(22) Filed: Sep. 19, 2002

(51) Int. Cl.
G06F 1/12 (2006.01)
H04L 7/00 (2006.01)
H03L 7/00 (2006.01)

(52) U.S. Cl. .................. 713/400; 375/354; 327/141
(58) Field of Classification Search ............... 713/400, 713/600; 375/354, 356, 362, 376, 327, 328, 375/326; 327/156, 141
See application file for complete search history.

(56) References Cited

U.S. PATENT DOCUMENTS

| 5,864,248 | A | * | 1/1999 | Rokugo | 327/156 |
| 5,889,829 | A | * | 3/1999 | Chiao et al. | 375/376 |
| 6,707,867 | B1 | * | 3/2004 | Diepstraten et al. | 375/354 |

FOREIGN PATENT DOCUMENTS

JP 2000174821 A * 6/2000

OTHER PUBLICATIONS

Pawlak et al, Exponential Weighting Algorithms for Reconstruction of Bandlimited Signals, Mar. 1996, IEEE, vol. 44, No. 3, pp. 538-545.*
R. Noro et al, "Circuit Emulation over IP Networks", IFIP 6th Inter. Workshop on Protocols for High-Speed Networks, Salem—MA, USA, Aug. 1999, pp. 187-201.
ATM Forum af-vtoa-0078.000, "Circuit Emulation Service Interoperability Specification Version 2.0", Jan. 1997.
R. C. Lau et al., "Synchronous Techniques for Timing Recovery in BISDN", Proc. IEEE Globecom, 1992, pp. 814-820.
G. F. Andreotti et al., "Clock Recovery and Reconstruction of PAL Pictures for MPEG Coded Streams Transported Over ATM Networks", IEEE Trans. Circuits and Systems for Video Technology, vol. 5, No. 6, Dec. 1995, pp. 508-514.

* cited by examiner

*Primary Examiner*—Thomas Lee
*Assistant Examiner*—Suresh K Suryawanshi
(74) *Attorney, Agent, or Firm*—Hunton & Williams LLP (57) ABSTRACT

A system and method for synchronizing a local clock to a reference clock using a linear model of the clock error between the local clock and the reference clock is disclosed. In one embodiment, a double-exponential smoothing process is used in conjunction with the linear model to estimate a frequency offset by which the frequency of an oscillator of the local clock is adjusted. Also disclosed herein is a phased-lock loop (PLL) adapted to synchronize a local clock with a reference clock using the double-exponential smoothing process, as well as a system implementing the PLL for timing the playout of data received from a transmitter.

20 Claims, 5 Drawing Sheets

CLOCK RECOVERY USING A DOUBLE-EXPONENTIAL SMOOTHING PROCESS

FIELD OF THE INVENTION

The present invention relates generally to clock synchronization between a local clock and a reference clock and, more particularly, to a technique for clock synchronization based in part on a double-exponential smoothing process of an error between the local clock and the reference clock.

BACKGROUND OF THE INVENTION

Clocking at the physical interface of a transmitter or receiver typically controls the speed at which data is transmitted/received on the physical connection. To eliminate transmission jitter resulting from the transmission of data, a jitter buffer often is needed at the receiver. The arrival rate and the departure rate from the jitter buffer typically are controlled, respectively, by the transmitter clock and the receiver clock. Ideally, the same amount of data is transmitted or forwarded at every point in the connection within any given time window when the transmitter clock and reference clock are synchronized. If the physical interfaces along a connection are not synchronized (i.e., not driven by a clocking signal of a substantially similar or equal frequency), data can be lost due to buffer overflow or underflow, resulting in periodic line errors. To keep a stable buffer level, frequency offsets between the transmitter and receiver often are eliminated or reduced either through driving the transmitter clock and receiver clock from a common global clock, or slaving the receiver clock to a transmitter clock by means of a phase-locked loop (PLL) which derives its reference clock signal from clock information provided by the transmitter clock.

One technique commonly implemented in packet-switched networks includes the synchronization of the transmitter clock and the receiver clock using timestamps (see, e.g., R. C. Lau and P. E. Fleischer, "Synchronous Techniques for Timing Recovery in BISDN," Proc. IEEE GLOBECOM, 1992, pp. 814–820). The transmitter sends a series of explicit time references as timestamps in a sequence of packets and the timestamps are used by the receiver to synchronize its clock to that of the transmitter. Since no common network clock is used, the receiver relies on locking its clock to the arrival of the timestamps. This technique is analogous to the common method of periodic insertion of synchronizing patterns into a bit stream at the transmitter, whereby the receiver is adapted to detect these synchronizing patterns and use them to generate a reference clock signal for a PLL at the receiver.

Techniques have been developed for clock synchronization using a linear modeling of the error between the transmitter clock and the receiver clock frequency. Using a linear regression analysis, the frequency offset between the transmitter clock and a receiver clock for a given time period or time instance is estimated or predicted and the receiver clock then is adjusted by this estimated error.

However, a major disadvantage in the use of the linear regression analysis as described above as an estimation technique is that a large number of time series values is needed to accurately estimate the model coefficients. The storage capacity for storing a large number of time series and the associated calculations could be prohibitive.

One clock synchronization technique based on a least-squares linear regression analysis is disclosed in a paper by R. Noro, M. Hamdi, and J. P. Hubaux, "Circuit Emulation over IP Networks," *IFIP 6$^{th}$ Inter. Workshop on Protocols for High-Speed Networks*, Salem, Mass., August 1999, pp. 187–201. This least-squares linear regression analysis-based clock synchronization technique observes and processes a relatively large sequence of consecutive clock samples (i.e., timestamps) to generate accurate timing signals. Although this technique and others based on least-squares linear regression analysis generally perform considerably more efficiently than conventional second-order PLLs, these techniques have the drawback of requiring large number of clock samples (thus, a large storage requirement) in order to generate accurate timing signals.

In view of the foregoing, it would be desirable to provide a technique for synchronizing a receiver clock with a transmitter clock that overcomes the above-describe inadequacies and shortcomings. More particularly, it would be desirable to provide a technique for timestamp-based clock synchronization between a transmitter and a receiver in a packet-switched network in an efficient and cost-effective manner.

SUMMARY OF THE INVENTION

In accordance with one embodiment of the present invention, a method for synchronizing a clock of a receiver with a clock of a transmitter is provided, wherein the transmitter is adapted to transmit a sequence of time references to the receiver, each time reference being representative of a time of transmission of the time reference. The method comprises the steps of, for each time reference of a subset of the sequence of time references, determining a clock error based in part on a difference between the time reference and a time of the receiver clock representative of a time of a reception of the time reference at the receiver, and determining a first-order smoothing value based in part on a weighted average of the clock error and a previous first-order smoothing value associated with a previous time reference of the sequence previously received at the receiver. The method further comprises the steps of determining a second-order smoothing value based in part on a weighted average of the first-order smoothing value and a second-order smoothing value associated with the previous time reference, and determining a frequency offset based in part on a difference between the first-order smoothing value and the second-order smoothing value.

In accordance with another embodiment of the present invention, a phase-locked loop (PLL) for synchronizing a local clock to a reference clock is provided. The PLL comprises an oscillator being adapted to output a local frequency and a loop filter being adapted to, for each time reference of a sequence of time references of the reference clock, determine a first-order smoothing value based in part on a weighted average of a previous first-order smoothing value associated with a previously received time reference of the sequence and a difference between the time reference and a corresponding time reference of the local clock, determine a second-order smoothing value based in part on a weighted average of the first-order smoothing value and a previous second-order smoothing value associated with the previously received packet, and determine a frequency offset based in part on a difference between the first-order smoothing value and the second-order smoothing value. The PLL further comprises an oscillator input conditioner operably connected to the loop filter and the oscillator and being adapted to modify the local frequency of the oscillator by the frequency offset.

In a packet-switched network, a system for playout of data of a sequence of packets transmitted from a transmitter is provided in accordance with yet another embodiment of the present invention. The system comprises a data buffer being adapted to store a data payload of each packet of the sequence of packets and a timestamp buffer being adapted to store a transmitter timestamp of each packet of the sequence of packets, the transmitter timestamp being representative of a time of a clock of the transmitter at a transmission of the packet. The system further comprises a playout module operably connected to the data buffer and the timestamp buffer and being adapted to direct an output of a data payload from the data buffer when a corresponding transmitter timestamp in the timestamp buffer is equivalent to a time of a local clock. The system also includes a phased-lock loop (PLL) being adapted to provide the local clock and being further adapted to, for each packet of the sequence of packets, determine a first-order smoothing value based in part on a weighted average of a clock error between the local clock and the transmitter clock and a previous first-order smoothing value associated with a previously received packet of the sequence, determine a second-order smoothing value based in part on a weighted average of the first-order smoothing value and a second-order smoothing value associated with the previously received packet, and modify a frequency of the local clock by a frequency offset based in part on a difference between the first-order smoothing value and the second-order smoothing value.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

FIGS. 1–5 illustrate exemplary techniques and systems for synchronizing a receiver clock with a transmitter clock using a linear model of the error between the transmitter clock and the receiver clock to estimate a frequency offset by which to adjust the frequency of an oscillator of the receiver clock. In at least one embodiment, the estimated frequency offset is determined based in part on a double-exponential smoothing process of the errors between the transmitter clock and the receiver clock. Also described herein is a phased-lock loop (PLL) adapted to synchronize a local clock with a reference clock using the double-exponential smoothing process, as well as a system implementing such a PLL for timing the playout of data received from a transmitter.

Clock synchronization techniques in accordance with at least one embodiment of the present invention can be used to synchronize the clocks of individual nodes in a network to a common reference, as a clock synchronization mechanism for circuit emulation services (CES) over packet networks, and the like. For example, to interwork circuit switched time-division multiplexing (TDM) networks through a packet switched network, the packet network generally is required to behave as a transparent "link" in the end-to-end path between the TDM networks. This transparent inclusion of a packet network in an end-to-end path of a connection that carries circuit-switched time-sensitive or TDM services often is referred to as "circuit emulation" on the packet network. CES allows a network operator to migrate network core infrastructure from circuit-switched TDM to packet-switched, while preserving the legacy circuit-switched TDM end equipment. A reliable and efficient clock synchronization scheme provides for the successful deployment of CES. A lack of synchronization traceability between TDM equipment interconnected over the packet network may result in frame or byte slips that can affect data integrity.

The present invention can be implemented in any of a variety of systems that benefit from clock synchronization. For instance, at least one embodiment of the present invention could be implemented as part of a networking protocol, such as the Real Time Protocol (RTP), used to transmit timing-sensitive data, such as multimedia or voice, over a packet-switched network. Various embodiments of the present invention can be implemented as hardware, software, or a combination thereof. For example, the exemplary clock synchronization methods described below could be implemented, in whole or part, as sets of instructions adapted to manipulate a processor or other processing device to perform the described process. Alternatively, the exemplary methods could be implemented, for example, as an application specific integrated circuit (ASIC), a microcontroller, programmable logic, and the like.

The term "clock synchronization," as used herein, refers to frequency synchronization rather than time synchronization. Frequency synchronization may be understood to refer to the synchronization of the frequency of a local clock to the frequency of a reference clock, without requiring or expecting the local clock and reference clock to be equal in phase (i.e., equal in their time value with respect to an absolute time reference).

A transmitter and a receiver of data in a network typically each have their own time bases that are driven by the internal clocks that both sides use in the transmission and reception of data. The receiver can be adapted to synchronize its time base to that of the transmitter. Ideally, the transmitter and receiver operate at the same frequency. In reality, however, the oscillators typically used in the transmitter clock (i.e., the reference clock) and the receiver clock (i.e., the local clock) have some non-constant frequency deviation from their nominal oscillation frequency, and therefore these time bases are not always the same, resulting in substantial frequency offset.

To illustrate, let S(t) and R(t) denote the time bases of the transmitter and the receiver, respectively. These two functions correspond to the timestamps of the two clocks at discrete time instant t, where t=1,2,3, . . . Generally there is a phase difference between the two time bases. Let also $f_s(t)$ and $f_r(t)$ denote the frequencies in cycles per second (Hertz) of the oscillator of the transmitter clock and the oscillator of the receiver clock, respectively.

A main purpose of most clock synchronization techniques is to estimate and compensate for the frequency offset (i.e., $f_s(t)-f_r(t)$) occurring between the oscillators of the transmitter clock and the receiver clock. Unfortunately, the presence of transmission jitter in the network affects the performance of typical clock estimation/compensation processes, making the transmitter clock appear to the receiver as being faster or slower than it actually is, ultimately causing the propagation of some residual jitter up to the receiver clock signal. The presence of even a modest amount of network jitter can make clock synchronization difficult.

The clock synchronization process may be stated as an estimation problem as follows. The receiver initializes its local clock to the first arriving transmitter timestamp, i.e., R(0)=S(0). When the PLL of the receiver receives a new timestamp S(t) it compares this with the local timestamp R(t) to generate an error signal:

$$T_e(t)=S(t)-R(t) \quad \text{EQ. 1}$$

A sequence of observations on the variable $T_e(t)$ forms a time series. The time series on $T_e(t)$ up to the current time period (or sample) T can be modeled by the following linear trend model:

$$x(t)=T_e(t)=b_1+b_2 t+\epsilon(t), \ t=1,2,\ldots,T \quad \text{EQ. 2}$$

where the coefficient $b_1$ represents the intercept (or the level at time t=0) of the linear model of EQ. 2, the coefficient $b_2$ represent the slope ($dT_e(t)/dt=b_2$) of the linear model, and $\epsilon(t)$ is a random component or "noise" in the process and includes all components such as clock noise, measurement noise, etc. Further, assume that this random component has mean $E[\epsilon(t)]=0$ and variance $Var[\epsilon(t)]=\sigma_\epsilon^2$, and is not serially correlated with random deviations at other times (i.e., $E[\epsilon(t)\epsilon(t+\psi)]=0$ for $\psi\neq 0$). Many processes or time series can be adequately described by this simple linear function of time t (EQ. 2). Note that in the clock synchronization problem summarized by the linear model of EQ. 2, the intercept coefficient $b_1$ represents the fixed time offset between the transmitter clock and the receiver clock, and the slope coefficient $b_2$ represents the frequency offset (i.e., the frequency deviation) of the receiver clock with respect to the transmitter clock. In other words:

$$b_2=f_s-f_r=\Delta f \quad \text{EQ. 3}$$

The mean of the time series process $x(t)=T_e(t)$ changes linearly with time, and at time t, the mean is $b_1+b_2 t$. However, the coefficients $b_1$ and $b_2$ are unknown. Accordingly, techniques have been developed to estimate the coefficients $b_1$ and $b_2$ using the method of least squares. An implementation of the least-squares method is described in the paper by R. Noro, M. Hamdi, and J. P. Hubaux, "Circuit Emulation over IP Networks," *IFIP 6th Inter. Workshop on Protocols for High-Speed Networks*, Salem, Mass., August 1999, pp. 187–201.

By estimating the frequency offset $\Delta f = \hat{b}_2$, the receiver clock frequency $f_r$ can be modified in order to reduce this offset to essentially zero, therefore setting the receiver clock frequency $f_r$ substantially equal to the transmitter clock frequency $f_s$. If $\hat{b}_2(T)$ is defined as the estimate of $b_2$ at the end of the most recent observation (or update) at time period T, then the receiver frequency can be updated as follows:

$$f_r(T)=f_r(T-1)+\hat{b}_2(T) \quad \text{EQ. 4}$$

The clock synchronization problem thus can be reduced to a linear regression analysis where the slope coefficient $\hat{b}_2=\Delta f$ is the coefficient to be determined from the time series of $T_e(t)$ values. Accordingly, the linear model of EQ. 2 can be used to determine the frequency offset $\Delta f$ by which the oscillator of the local clock is to be adjusted to synchronize the local clock with the reference clock. In such a case, the desired frequency offset $\Delta f$ can be shown to be represented by the model coefficient $b_2$ of the linear model of EQ. 2 (i.e., $\Delta f=b_2$).

In order to decrease the storage requirements for the time series $T_e(t)$ and/or decrease the required processing effort compared to known techniques for estimating the coefficients $\hat{b}_1$ and $\hat{b}_2$, at least one embodiment of the present invention provides a technique for estimating the frequency offset $\Delta f$ (i.e., estimating the coefficient $b_2$ of EQ. 2) based in part on a double-exponential smoothing process of a subset of a sequence of observations (i.e., the reception of timestamps at the receiver). The implementation of an exemplary double-exponential smoothing process using the linear model of EQ. 2 follows.

If a simple exponential smoothing were applied to the observations from the linear process of EQ. 2, the following would be obtained at the end of period T:

$$S_s(T)=\alpha x(T)+(1-\alpha)S_s(T-1) \quad \text{EQ. 5}$$

where $S_s(T)$ is the first-order smoothed value (or the smoothed statistic) and $\alpha$ is the smoothing constant chosen so that $0<\alpha<1$. The statistic $S_s(T)$ is a weighted average of all past observations. To prove this, it can be shown that $S_s(T)$ can be written as a linear combination of past data. Based on this linear combination, it can be observed that the weights given to past observations are nonnegative and add to 1, thus making it possible to interpret $S_s(T)$ as a weighted average. Substituting for $S_s(T-1)$ in the right-hand side of EQ. 5, EQ. 6 may be obtained:

$$\begin{aligned}S_S(T) &= \alpha x(T) + (1-\alpha)[\alpha x(T-1)+(1-\alpha)S_S(T-2)] \\ &= \alpha x(T)+\alpha(1-\alpha)x(T-1)+(1-\alpha)^2 S_S(T-2)\end{aligned} \quad \text{EQ. 6}$$

Continuing to substitute recursively for $S_s(T-k)$, k=2, 3, . . . ,T, EQ. 7 can be obtained:

$$S_S(T)=\alpha\sum_{k=0}^{T-1}(1-\alpha)^k x(T-k)+(1-\alpha)^T S_S(0) \quad \text{EQ. 7}$$

where $S_s(0)$ is the initial estimate used to start the smoothing process. The weights sum to unity, since:

$$\alpha \sum_{k=0}^{T-1} (1-\alpha)^k = \alpha \left[ \frac{1-(1-\alpha)^T}{1-(1-\alpha)} \right] = 1-(1-\alpha)^T \quad \text{EQ. 8}$$

With the exception of the coefficient of $S_s(0)$, the weights decrease geometrically with the age of the observations. Because these weights appear to decline exponentially when connected by a smooth curve, the term "exponential smoothing" is often used to describe this process.

Letting $\beta=1-\alpha$ in EQ. 7 for convenience:

$$S_S(T) = \alpha \sum_{k=0}^{T-1} \beta^k x(T-k) + \beta^T S_S(0) \quad \text{EQ. 9}$$

Taking expected values:

$$E[S_S(T)] = \alpha \sum_{k=0}^{T-1} \beta^k E[x(T-k)] + \beta^T S_S(0) \quad \text{EQ. 10}$$

$$= \alpha \sum_{k=0}^{T-1} \beta^k [b_1 + b_2(T-k)] + \beta^T S_S(0)$$

As $T \to \infty$, $\beta^T = 0$ and:

$$E[S_S(T)] = (b_1 + b_2 T)\alpha \sum_{k=0}^{\infty} \beta^k - b_2 \alpha \sum_{k=0}^{\infty} k\beta^k \quad \text{EQ. 11}$$

$$= b_1 + b_2 T - \frac{\beta}{\alpha} b_2$$

Since $E[x(T)] = b_1 + b_2 T$:

$$E[S_S(T)] = E[x(T)] - \frac{\beta}{\alpha} b_2 \quad \text{EQ. 12}$$

EQ. 12 above shows that, for a linear model such as EQ. 2, the first-order exponentially smoothed statistic, $S_s(T)$, will tend to lag behind the true signal by an amount equal to $$\frac{\beta}{\alpha} b_2.$$

Now suppose a second exponential smoothing operator is applied to the output of EQ. 9, that is:

$$S_D(T) = \alpha S_s(T) + (1-\alpha) S_D(T-1) \quad \text{EQ. 13}$$

where $S_D(T)$ represents the double-exponential smoothing value, or second-order exponential smoothing value. By proceeding as above, it can be shown that:

$$E[S_D(T)] = E[S_S(T)] - \frac{\beta}{\alpha} b_2 \quad \text{EQ. 14}$$

and therefore:

$$b_2 = \frac{\alpha}{\beta}[E[S_S(T)] - E[S_D(T)]] \quad \text{EQ. 15}$$

Thus, $b_2$ can be estimated at the end of period T as:

$$\hat{b}_2(T) = \frac{\alpha}{\beta}[S_S(T) - S_D(T)] \quad \text{EQ. 16}$$

The expected value of x at the end of period T may be obtained from EQ. 14 and EQ. 15 as:

$$E[x(T)] = E[S_S(T)] + \frac{\beta}{\alpha}\frac{\alpha}{\beta}[E[S_S(T)] - E[S_D(T)]] \quad \text{EQ. 17}$$

$$= 2E[S_S(T)] - E[S_D(T)]$$

Again, an estimate of $E[x(T)]$, made at the of period T, could be:

$$\hat{x}(T) = 2S_s(T) - S_D(T) \quad \text{EQ. 18}$$

Recall that the coefficient $b_2$ of the linear model of EQ. 2 can be shown to represent the frequency offset (i.e., the frequency deviation) between the reference clock and the local clock. Accordingly, the double-exponential smoothing process described above can be utilized to estimate the frequency offset $\Delta f = \hat{b}_2$ by which the frequency of the local clock may be adjusted.

Figure 1:
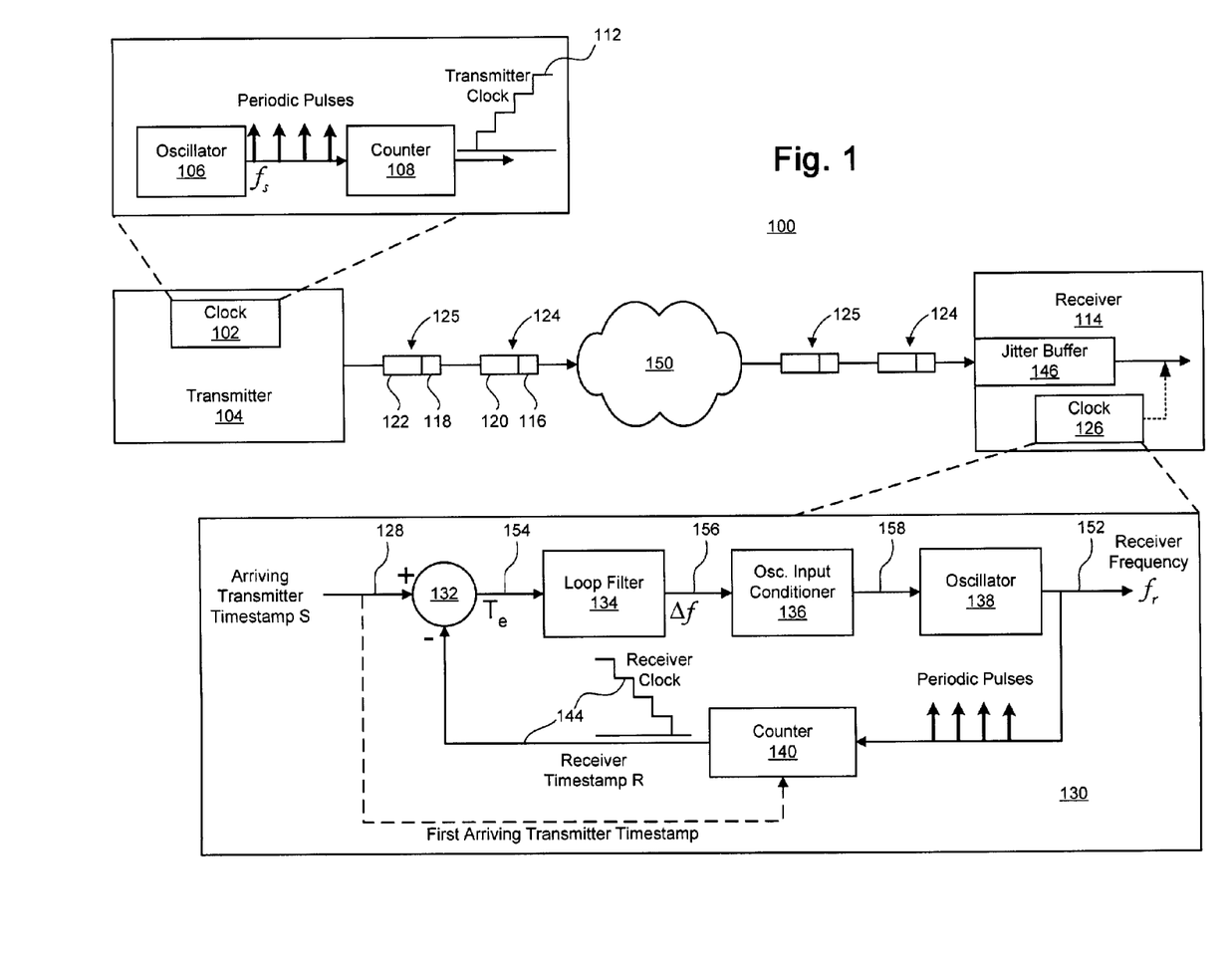
FIG. 1 is a schematic diagram illustrating an exemplary system having a phase-locked loop (PLL) for clock synchronization in accordance with at least one embodiment of the present invention.

Referring now to FIG. 1, an exemplary system 100 implementing a clock synchronization technique in accordance with at least one embodiment of the present invention is illustrated. In the illustrated example, a transmitter 104 is adapted to provide a sequence of timestamps (timestamps 116, 118) to a receiver 114 via a network 150, where the timestamps are transmitted in a sequence of packets (packets 124, 125). Each packet also may include one or more data payloads (data payloads 120, 122) corresponding to the associated timestamp. The receiver 114, using the sequence of timestamps, synchronizes the receiver clock 126 to the transmitter clock 102. The synchronized receiver clock 126 then can be used by the receiver 114 to, for example, process the data payloads 120, 122 of the packets.

To illustrate, the system 100 could include a Voice Over Internet Protocol (VoIP) system whereby a user's voice at the transmitter 104 is converted to digital data, packetized by the transmitter 104, and the packets provided to the receiver 114 with their corresponding timestamps over the network 150. The receiver 114 then stores the data payloads/timestamps in a jitter buffer 146. At the appropriate time, as determined by the associated timestamp and the receiver clock 126, a data payload is extracted from the jitter buffer 146 and converted to an audio output for the user of the receiver 114.

In such an implementation, it often is desirable to maintain synchronization between the transmitter clock 102 of the transmitter 104 and the receiver clock 126 of the receiver 114 to prevent overflow/underflow of the jitter buffer 146, improper timing in the playout of data from the jitter buffer 146, and the like. Accordingly, in at least one embodiment, the receiver 114 utilizes a phase-locked loop (PLL) 130 to synchronize with the transmitter clock 102. The PLL 130 is described in greater detail below.

The transmitter clock 102 of the transmitter 104 typically includes an oscillator 106 and a pulse counter 108. The oscillator 106 issues periodic pulses that are input to the pulse counter 108. The oscillator frequency $f_s$ of the transmitter clock 102 is the inverse of the time interval between consecutive pulses (i.e., the oscillator period). The output of the pulse counter 108 represents the transmitter clock signal 112 and is incremented by a fixed amount at each pulse. Samples of the transmitter clock signal 112 are provided to the receiver 114 as timestamps 116, 118 in a sequence of packets 124, 126 transmitted over the network 150.

Ideally, there would be a constant delay between the transmitter 104 and the receiver 114, and the timestamps 116, 118 arrive at the receiver 114 at the pace at which they are sent.

However, packet-switched networks (e.g., network 150) typically do not emulate this ideal case. Delay variation between the transmitter 104 and the receiver 114 during transmission of a sequence of packets (e.g., packets 124, 125) over the network 150 typically complicates a conventional clock synchronization process because of the network jitter introduced at the receiver 114. The receiver 114 may not be able to provide a sufficiently stable and accurate receiver clock signal 144 if the jitter is not filtered out. As a result, in at least one embodiment the PLL 130 is adapted to perform filtering in order to correctly estimate/recover the transmitter clock 102.

Typically it is desired that the design of the PLL 130 must be such that its filtering capabilities do not slow the responsiveness of the PLL 130 and/or increase the amount of time it requires to estimate the clock frequency of the transmitter clock 102. Slow PLL responsiveness and increased transmitter clock estimation time affect the maximum phase error between the transmitter clock 102 and the receiver clock 126 which in turn increases the amount of memory in the receiver 114 that must be allocated to the jitter buffer 146 used to buffer unread data. The jitter buffer 146 often is required to be a least the size of the jitter amplitude (statistical bound) that the receiver 114 is configured to absorb. Packets that experience more delay than the maximum jitter amplitude in this case typically are discarded.

In at least one embodiment, the PLL 130 is adapted to provide a receiver frequency $f_r$ that is substantially synchronized with the frequency $f_s$ of the transmitter clock 102 using the timestamps of a sequence of packets transmitted from the transmitter 104. When the first timestamp of the sequence arrives at the PLL 130, a counter 140 is initialized to the value of the first transmitter timestamp (herein referred to as $S_0$). Accordingly, after each pulse (or set number of pulses) of the output signal 152 of the oscillator 138, the counter 140 increments the receiver clock signal 144 starting at the base value $S_0$.

At the arrival of the each of the remaining transmitter timestamp S(T) of the sequence, a phase detector 132 compares the value of the timestamp S(T) (signal 128) with the timestamp R(T) of the counter 140 at the arrival of the transmitter stamp S. Based on the difference, or error, between the two timestamps R, S, the phase detector 132 provides an error signal $T_e$ (signal 154) to the loop filter 134, where the error signal $T_e$, in one embodiment, is equivalent to the difference between the transmitter timestamp S(T) and the receiver timestamp R(T), i.e., $T_e(T)=S(T)-R(T)$.

In one embodiment, the loop filter 134 is adapted to estimate a frequency offset $\Delta f$ (signal 156) by which to adjust the receiver frequency $f_r$ of the oscillator 138 based in part on a double-exponential smoothing process of the error between the transmitter clock 102 and the receiver clock 126. An exemplary implementation of the double-exponential smoothing process by the loop filter 134 is illustrated in greater detail with reference to FIG. 4.

The oscillator input conditioner 136, in one embodiment, is adapted to provide a control signal 158 to the oscillator 138 to direct the oscillator 138 to adjust its receiver frequency $f_r$ by the frequency offset $\Delta f$ determined by the loop filter 134. In one embodiment, the oscillator 138 includes a voltage controlled oscillator (VCO). In this case, the oscillator input conditioner 136 can be adapted to provide a value u (one embodiment of signal 158) to the oscillator 138 that corresponds to a change in the receiver frequency $f_r$ of the oscillator 138 by the frequency offset $\Delta f$, wherein the value u is determined based in part on the frequency offset $\Delta f$ and the receiver frequency $f_r$ prior to the adjustment. In another embodiment, the oscillator 138 includes a digitally controlled oscillator (DCO). In this case, the oscillator input conditioner 136 is adapted to determine the appropriate digital output to direct the oscillator 138 to adjust its receiver frequency $f_r$ by the frequency offset $\Delta f$.

For ease of discussion, the loop filter 134 and the oscillator input conditioner 136 are illustrated as separate elements of the PLL 130. However, some or all of the functions of the oscillator input conditioner 136 may be implemented as part of the loop filter 134, and vice versa, without departing from the spirit or the scope of the present invention.

As the frequency $f_r$ of the oscillator 138 changes, the rate-of-increase of receiver clock signal 144 of the counter 140 increases or decreased relative to the adjustments to the receiver frequency $f_r$. Accordingly, as each timestamp of the sequence arrives, the PLL 130 can adjust its receiver frequency $f_r$ to more closely match the frequency $f_r$ of the transmitter clock. Furthermore, because the loop filter 134, in at least one embodiment, is adapted to perform one or more varieties of the exemplary double-exponential smoothing process of FIG. 4, both the data storage requirements and the processing effort can be kept to a minimum compared to other known techniques for clock synchronization.

Figure 2:
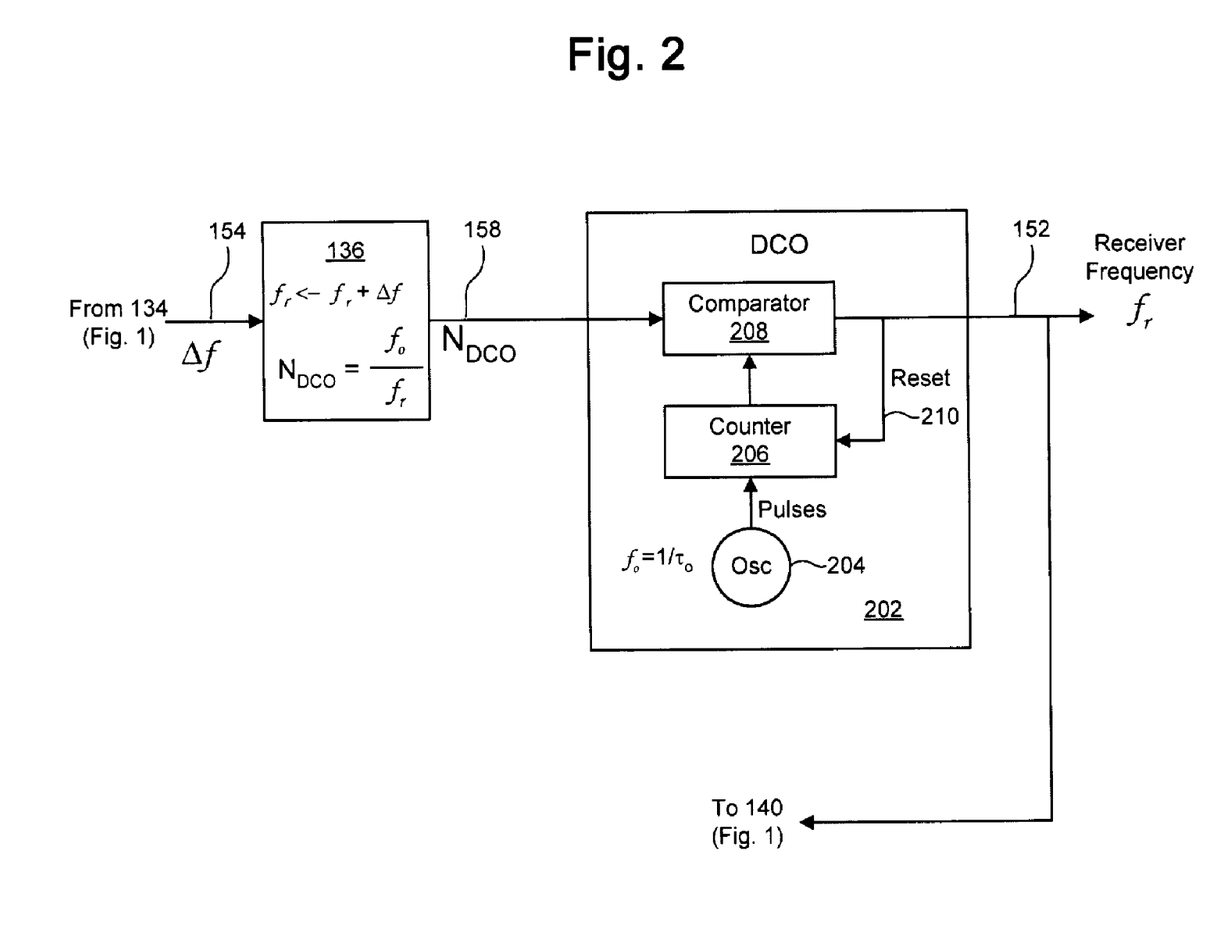
FIG. 2 is a schematic diagram illustrating an exemplary implementation of a digitally controlled oscillator (DCO) in the PLL of FIG. 1 in accordance with at least one embodiment of the present invention.

Referring now to FIG. 2, an exemplary implementation of the oscillator 138 of the PLL 130 as a digitally controller oscillator (DCO) 202 is illustrated in accordance with at least one embodiment of the present invention. As discussed above, in one embodiment the oscillator input conditioner 136 is adapted to provide a signal 158 to the oscillator 138 to direct the oscillator 138 to modify its receiver frequency $f_r$ based in part on the frequency offset $\Delta f$ (signal 154) provided from the loop filter 134 (FIG. 1). In one embodiment, the oscillator 138 is implemented as the DCO 202 adapted to output a certain frequency based in part on a digital value (signal 158) supplied at its input.

In this case, the oscillator input conditioner 136 may be adapted to determine the desired updated frequency $f_r$ by modifying the previous frequency $f_r$ by the supplied frequency offset $\Delta f$ (i.e., $f_r = f_r + \Delta f$). Based on the updated frequency $f_r$ the oscillator input conditioner 136 then can determine a digital value $N_{DCO}$ to provide to the DCO 202 to direct the DCO 202 to output the desired updated frequency $f_r$.

In one embodiment, the DCO 202 includes an internal oscillator 204 having a frequency $f_o >> f_r$. For each pulse of the oscillator 204, the internal count value of a counter 206 of the DCO 202 is incremented. A comparator 208 compares the internal count value in the counter 206 with the input value $N_{DCO}$ to determine a match. Each time $N_{DCO}$ is equal to the internal count value during a comparison, the comparator 208 outputs a pulse that serves as both the receiver clock pulse with receiver frequency $f_r$ (signal 152) as well as a reset signal 210 for the counter 206. The frequency $f_r$, therefore, is equal to the ratio of the oscillator frequency $f_o$ to the input value $N_{DCO}$. In effect, the DCO 202 acts as a divide-by-N circuit, where $N=N_{DCO}$. Accordingly, the oscillator input conditioner 136 can be adapted to determine the value for $N_{DCO}$ corresponding to the desired updated receiver frequency $f_r$ by setting the value of $N_{DCO}$ as the ratio of the oscillator frequency $f_o$ to the receiver frequency $$f_r \left( i.e., N_{DCO} = \frac{f_o}{f_r} \right).$$

Figure 3:
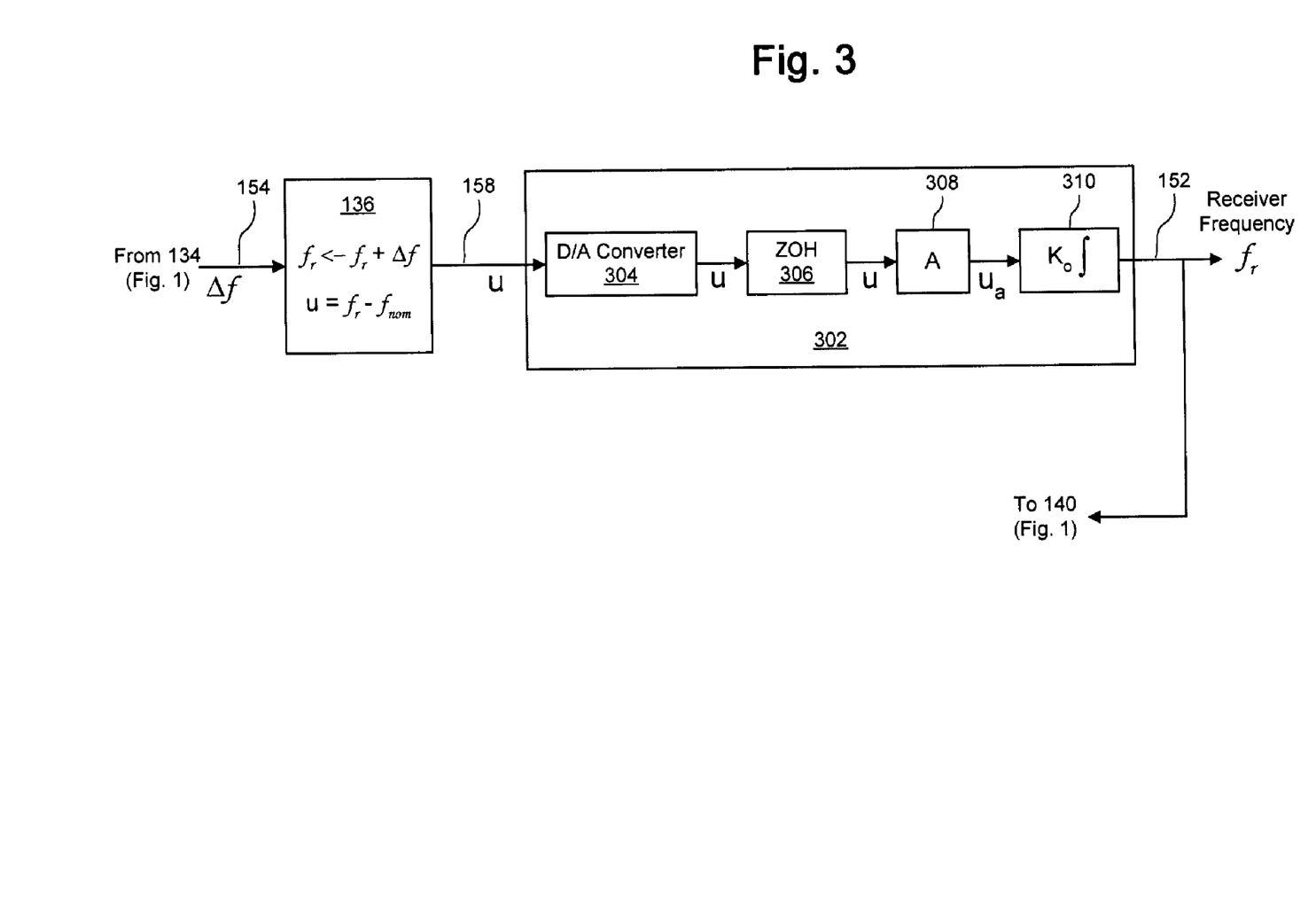
FIG. 3 is a schematic diagram illustrating an exemplary implementation of a voltage controlled oscillator (VCO) in the PLL of FIG. 1 in accordance with at least one embodiment of the present invention.

Referring now to FIG. 3, an exemplary implementation of the oscillator 138 of the PLL 130 as a module containing a voltage controlled oscillator (VCO module) 302 is illustrated in accordance with at least one embodiment of the present invention. Rather than implementing a DCO (DCO 202, FIG. 2) as discussed above, in one embodiment, the PLL 130 implements a VCO 310 to provide the receiver frequency $f_r$ (signal 152), whereby adjustments to the receiver frequency $f_r$ of the VCO 310 are based in part on an input value u (signal 158) received at its input.

In this case, the oscillator input conditioner 136 may be adapted to determine the value for u corresponding to the desired updated frequency $f_r$. After receiving the estimated frequency offset $\Delta f$ from the loop filter 134 (FIG. 1), the oscillator input conditioner 136 determines the desired updated frequency $f_r$ by adjusting the frequency $f_r$ by the frequency offset $\Delta f$. However, in one embodiment, the VCO module 302 is adapted to receive a value for u representative of the difference between the desired receiver frequency $f_r$ and the nominal (or center) frequency $f_{nom}$ of the VCO 310 (i.e., $u=f_r-f_{nom}$). Accordingly, the oscillator input conditioner 136 can be adapted to calculate the value u corresponding to the desired updated frequency $f_r$ and provide this value u to the VCO module 302 as signal 158.

A digital value u can be converted to an analog signal using a digital-to-analog (D/A) converter 304. A zero-order hold (ZOH) circuit 306 may be used (separately or as part of the D/A converter 304) to maintain the same voltage throughout a sample period. The analog voltage then is amplified by amplifier 308 and the amplified voltage is then provided to the VCO 310. Accordingly, the amplifier 308 can be adapted to maintain the input voltage to the VCO 310 within the input voltage range of the VCO 310. Note that the minimum frequency resolution of the internal VCO 310 generally is dependent on the resolution (i.e., the quantization step size) of the D/A converter 304, where a higher resolution typically provides a finer frequency control of the VCO 310.

Although FIGS. 2 and 3 illustrate various implementations of the oscillator 138 of the PLL 130, those skilled in the art can develop alternate implementations using the guidelines provided herein. To illustrate, the oscillator 138 could include a current controlled oscillator (CCO) rather than a VCO. In this instance, the output signal of the D/A converter 304 could be a controlled current rather than a controlled voltage.

Figure 4:
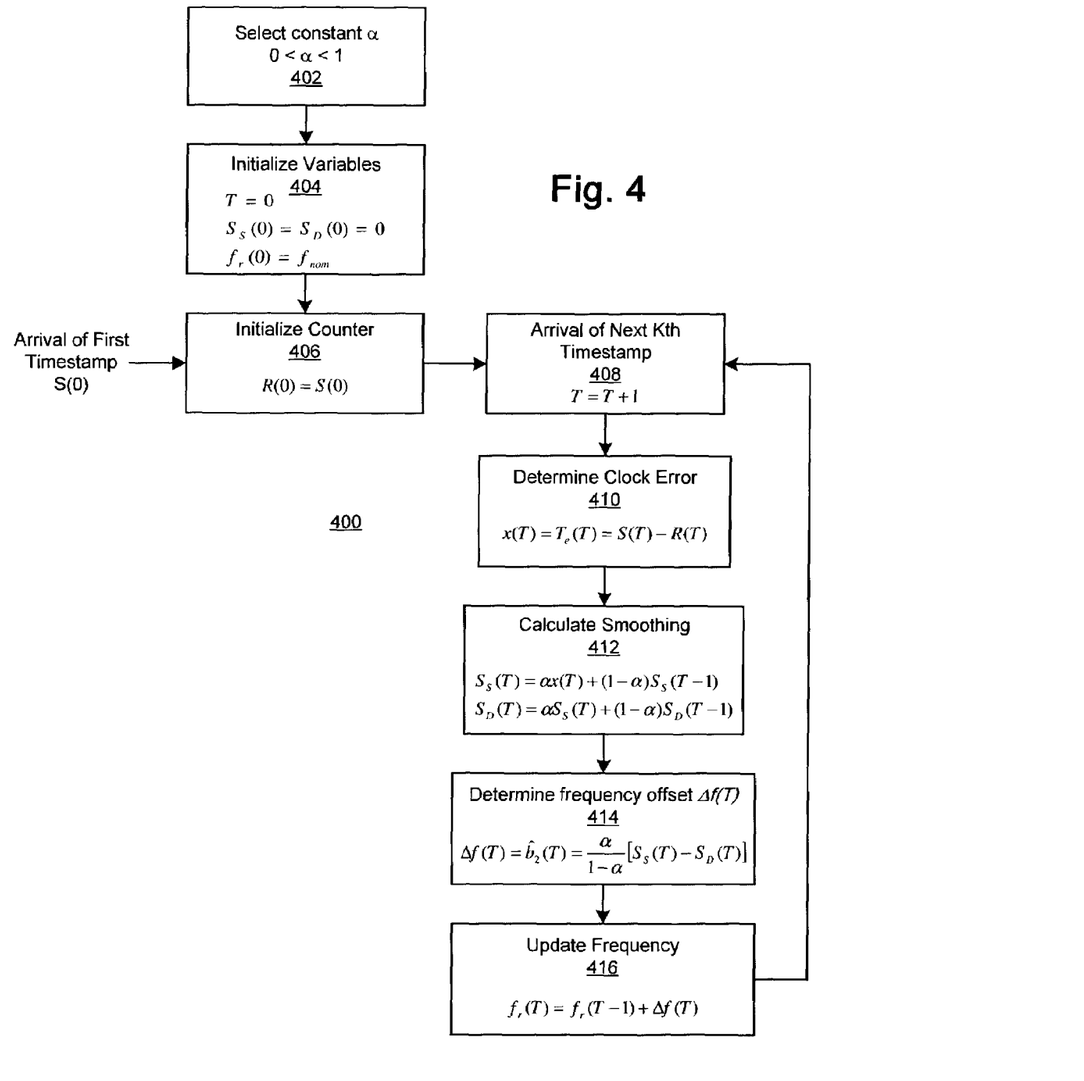
FIG. 4 is a flow diagram illustrating an exemplary method for clock synchronization based in part on a double-exponential smoothing process in accordance with at least one embodiment of the present invention.

Referring now to FIG. 4, an exemplary method for clock synchronization between a transmitter and a receiver based in part on estimation of a frequency offset using a linear model of the error between transmitter timestamp(s) and the corresponding receiver timestamp(s) are illustrated. In at least one embodiment, one or more variations of the following method 400 may be utilized by the loop filter 134 of the PLL 130 (FIG. 1) in determining the frequency offset $\Delta f$ by which the receiver frequency $f_r$ of the PLL 130 is modified.

FIG. 4 illustrates an exemplary method 400 for clock synchronization using a double-exponential smoothing process in conjunction with the linear model of EQ. 2 representing the error between a reference clock and a local clock. While exemplary method 400 is discussed below in the context of the loop filter 134 of the PLL 130 of FIG. 1 for ease of illustration, the exemplary method 400 may be implemented in any of a variety of systems without departing from the spirit or the scope of the present invention.

The method 400 initiates at step 402 whereby an appropriate weighting constant $\alpha$ is selected, where $0<\alpha<1$. The weighting constant $\alpha$ can be selected based on, for example, a historical performance analysis of a number of potential values for the weighting constant $\alpha$, by trial-and-error, and the like.

Prior to the receipt of the first timestamp in the sequence, the variables/coefficients used in the linear model of EQ. 2 and/or the double-exponential smoothing process are initialized to zero at step 404. That is:

$T=0$                    EQ. 19

$S_S(0)=S_D(0)=0$            EQ. 20

$f_r(0)=f_{nom}$                 EQ. 21 where $S_S(T)$ and $S_D(T)$ are the first-order smoothed value and second-order smoothed value, respectively, at time T, $f_r(T)$ is the receiver frequency $f_r$ of the PLL 130 at time T, and $f_{nom}$ is the nominal frequency of the oscillator 138 (FIG. 1) of the PLL 130.

Upon receipt of the first arriving transmitter timestamp, S(0), the counter 140 is initialized to the value of the timestamp S(0) at step 406, that is:

$R(0)=S(0)$                EQ. 22

When the PLL 130 receives a new timestamp S(T) of the remaining timestamps of the sequence, the PLL 130 determines a timestamp error x(T) based on the difference between the incoming timestamp S(T) and the corresponding local timestamp R(T) at step 410, where:

$x(T)=T_e(T)=S(T)-R(T)$        EQ. 23

At step 412, the first-order smoothing value $S_S(T)$ is determined based in part on a weighted average (using the weighting factor $\alpha$) of the actual timestamp error x(T) and the previous first-order smoothing value $S_S(T-1)$ associated with the previous timestamp received by the PLL 130. Similarly, the second order smoothing value $S_D(T)$ is calculated based in part on a weighted average (using the weighting factor $\alpha$) of the first-order smoothing value $S_S(T)$ of the current timestamp and the previous second-order smoothing value $S_D(T-1)$ associated with the previous timestamp. To illustrate:

$S_S(T)=\alpha x(T)+(1-\alpha)S_S(T-1)$      EQ. 5

$S_D(T)=\alpha S_S(T)+(1-\alpha)S_D(T-1)$     EQ. 13

At step 414, the frequency offset $\Delta f$ (T) for the current timestamp is determined based in part on a difference between the first-order smoothing value $S_S(T)$ and the second-order smoothing value $S_D(T)$, where:

$$\Delta f(T) = \hat{b}_2(T) = \frac{\alpha}{1-\alpha}[S_S(T) - S_D(T)] \qquad \text{EQ. 24}$$

At step 416, the value of frequency $f_r$ at the previous time period T−1 and the frequency offset $\Delta f$ (T) are used to estimate the updated value for the frequency $f_r$ at time T as follows:

$$f_r(T) = f_r(T-1) + \Delta f(T) \qquad \text{EQ. 25}$$

The updated frequency $f_r(T)$ then can be utilized by the oscillator input conditioner 136 (FIG. 1) to direct the oscillator 138 (FIG. 1) to modify its frequency $f_r$ by the frequency offset $\Delta f$ (T) to substantially match the updated frequency $f_r(T)$. For the arrival of each successive Kth timestamp of the sequence of timestamps (step 408), the value of T is incremented by one and the steps 410–416 are repeated.

As described above, a relatively small number of calculations need be performed, thereby increasing the speed at which a device or application performing the method 400 can operate. Likewise, because only the error needs to be smoothed at each time, the storage requirements of the PLL 130 can be reduced, which thereby may reduce the cost, size, complexity, and/or energy consumption of the PLL 130.

Figure 5:
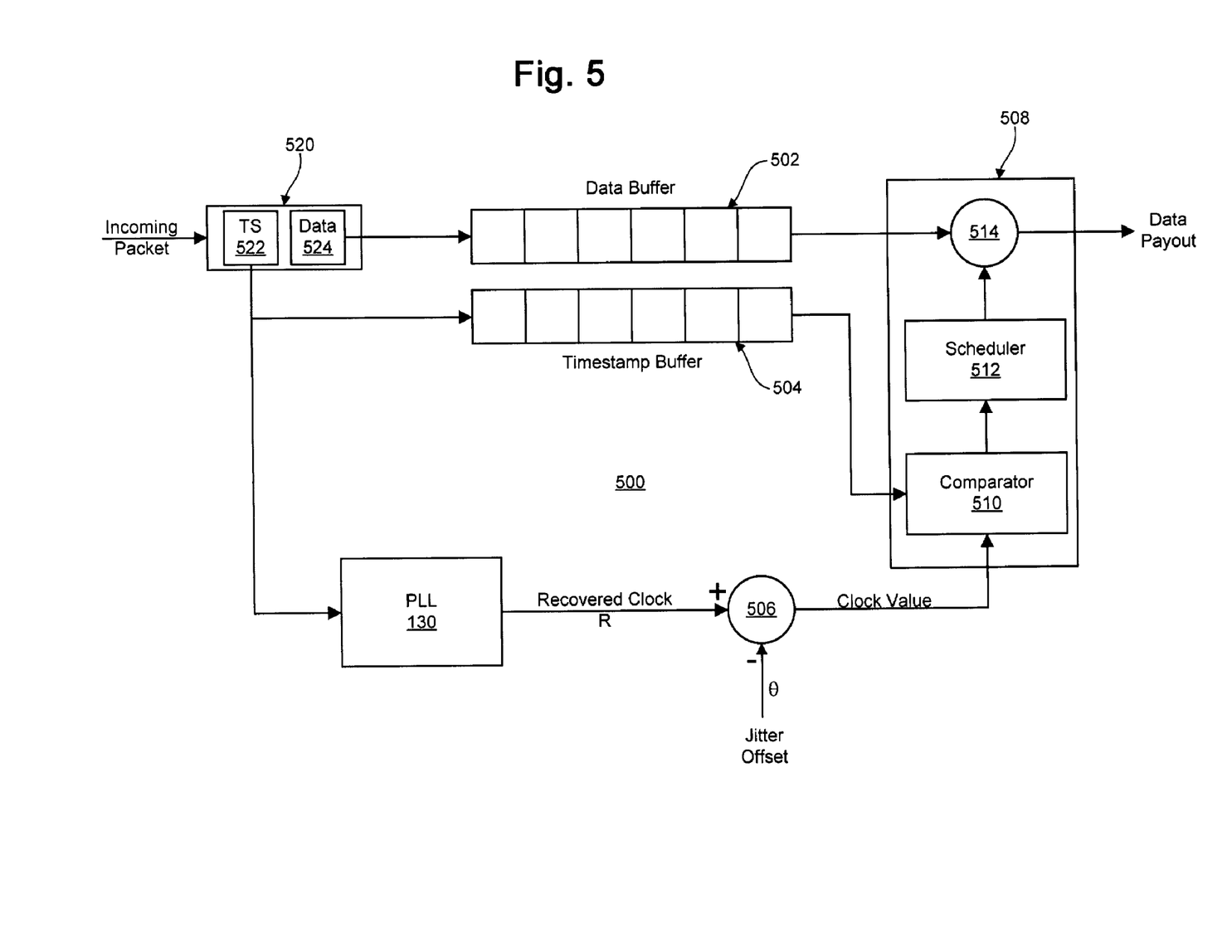
FIG. 5 is a schematic diagram illustrating an exemplary data playout system in accordance with at least one embodiment of the present invention.

Referring now to FIG. 5, an exemplary implementation of the PLL 130 in a data playout system 500 is illustrated in accordance with at least one embodiment of the present invention. In the illustrated example, the system 500 includes a data buffer 502, a timestamp buffer 504, the PLL 130, a jitter offset module 506, and a playout module 508 having a comparator 510, a scheduler 512, and a time-division multiplexer (TDM) 514.

An exemplary playout process of the system 500 using a recovered reference clock signal and the counter value R(t) of the counter 140 (FIG. 1) of the PLL 130 can be described as follows. For each data packet 520 of a sequence of packets arriving from a transmitter over a packet network (not shown), the timestamp (TS) 522, S(t), of the packet 520 is read and stored in the timestamp buffer 504 and the data payload 524 of the packet 520 is placed in the receiver data buffer 502. A copy of the timestamp 522 is also provided to the PLL 130.

Using the transmitter timestamps 522 from the sequence of packets 520, the PLL 130, in one embodiment, is adapted to determine a frequency offset $\Delta f$ representing an error between the frequency $f_r$ of the oscillator 138 (FIG. 1) and the frequency $f_s$ of the transmitter. The PLL 130 then may adjust the frequency $f_r$ by the frequency offset $\Delta f$ to more closely match the oscillator frequency $f_s$ of the transmitter. In at least one embodiment, the PLL 130 determines the frequency offset $\Delta f$ using the double-exponential smoothing process as discussed above with reference to FIG. 4.

Using the synchronized oscillator 138, the internal count of the counter 140 (FIG. 1) of the PLL 130 is monotonically increased. The internal count, representing the synchronized clock R(t) is provided to the playout module 508 for use in timing the playout of data payloads from the data buffer 502. However, since there may be a delay or jitter component in the recovered clock R(t) due to jitter or delay in the packet network between the transmitter an the receiver implementing the system 500, in one embodiment, the jitter offset module 506 is adapted to adjust the recovered clock R(t) by a jitter offset θ to generate a modified clock R'(t) where R'(t)=R(t)−θ. The jitter offset θ preferably is selected to account for the maximum jitter amplitude and packet loss rate that is or may be present. Accordingly, the size of the buffers 502, 504 preferably are at least the size of the statistical bound of the delay variations. The modified clock R'(t) then may be provided to the playout module 508 for timing the output of data from the data buffer 502.

The comparator 510 of the playout module 508 periodically compares the modified clock R'(t) (or the original clock R(t)) with the timestamp stored at the front of the timestamp buffer 504. When the modified clock R'(t) is equal to the timestamp (or within a predetermined range of the timestamp), the comparator 510 sends a signal to the scheduler 512 indicating a match. The scheduler, based on this signal, directs the TDM 514 to output the corresponding data payload from the data buffer 502 and provide the data payload to the intended destination. Likewise, the timestamp at the front of the buffer 504 is removed and the comparator 510 periodically compares the next timestamp in the buffer 504 to the modified clock value R'(t) obtained from the counter 140 of the PLL 130. The process of comparing the modified clock R'(t) (or R(t)) with the timestamp at the front of the buffer 504 and outputting the corresponding data payload from the data buffer 502 when there is a match may be repeated for each packet or a subset of packets of the sequence.

The exemplary system 500 may be implemented in any of a variety of applications having stringent timing requirements, such as multimedia applications, telephony applications, and the like. To illustrate, the system 500 could be utilized in a Voice over Internet Protocol (VoIP) application whereby voice communications are packetized by a transmitter and the resulting packets are then transmitted over a packet switched network to a receiver. The receiver, using its local clock, provides the data payload of each packet to a playout application at a time corresponding to the timestamp associated with the data payload. The playout application then converts the digital data to an analog signal (i.e., sound) for reception by the user of the receiver. The system 500 can be implemented to buffer the data payloads of the VoIP packets and provide the data payloads to a VoIP playout application at the appropriate time using the clock of the PLL 130.

Since the timing of the playout of the VoIP data payloads typically is critical to prevent garbled or otherwise unintelligible audio playback, often it is beneficial to synchronize the receiver's clock with the clock of the transmitter. Accordingly, the PLL 130 can periodically adjust the frequency $f_r$ to more closely match the frequency $f_s$ of the transmitter clock, thus synchronizing the receiver clock to the transmitter clock and providing for a higher-fidelity playout of the audio content of the VoIP packets.

At this point it should be noted that techniques for clock synchronization in accordance with the present invention as described above typically involve the processing of input data and the generation of output data to some extent. This input data processing and output data generation may be implemented in hardware or software. For example, specific electronic components may be employed in a processor, integrated circuit, or similar or related circuitry for implementing the functions associated with clock synchronization in accordance with the present invention as described above. Alternatively, one or more processors operating in accordance with stored instructions may implement the functions associated with the exemplary clock synchronization techniques in accordance with the present invention as described above. If such is the case, it is within the scope of the present invention that such instructions may be stored on one or more processor readable media, or transmitted to one or more processors via one or more signals.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for synchronizing a clock of a receiver with a clock of a transmitter, wherein the transmitter is adapted to transmit a sequence of time references to the receiver, each time reference being representative of a time of transmission of the time reference, the method comprising the steps of:

for each time reference of a subset of the sequence of time references:

determining a clock error based in part on a difference between the time reference and a time of the receiver clock representative of a time of a reception of the time reference at the receiver;

determining a first-order smoothing value based in part on a weighted average of the clock error and a previous first-order smoothing value associated with a previous time reference of the sequence previously received at the receiver;

determining a second-order smoothing value based in part on a weighted average of the first-order smoothing value and a second-order smoothing value associated with the previous time reference; and determining a frequency offset based in part on a difference between the first-order smoothing value and the second-order smoothing value.

2. The method as in claim 1, wherein the step of determining the first-order smoothing value is based in part on an equation:

$$S_s(T) = \alpha x(T) + (1-\alpha) S_s(T-1)$$

where $S_s(T)$ represents a first-order smoothing value associated with a time reference received at time T, $x(T)$ represents a clock error between the transmitter clock and the receiver clock associated with the time reference received at time T, $S_s(T-1)$ represents a first-order smoothing value associated with a previous time reference received at time T−1 previous to time T, and $\alpha$ represents a real-value weighting factor between zero and one.

3. The method as in claim 1, wherein the step of determining the second-order smoothing value is based in part on an equation:

$$S_D(T) = \alpha S_s(T) + (1-\alpha) S_D(T-1)$$

where $S_D(T)$ represents a second-order smoothing value associated with a time reference received at time T, $S_D(T-1)$ represents a second-order smoothing value associated with a previous time reference received at time T−1 previous to time T, $S_s(T)$ represents a first-order smoothing value associated with the time reference received at time T, and $\alpha$ represents a real-value weighting factor between zero and one.

4. The method as in claim 1, wherein the step of determining the frequency offset is based in part on an equation:

$$\Delta f(T) = \frac{\alpha}{1-\alpha}[S_S(T) - S_D(T)]$$

where $\Delta f(T)$ represents the frequency offset associated with a time reference received at time T, $S_D(T)$ represents a second-order smoothing value associated with the time reference, $S_s(T)$ represents a first-order smoothing value associated with the time reference, and $\alpha$ represents a real-value weighting factor between zero and one.

5. The method as in claim 1, further comprising the step of modifying, for each time reference of the subset, a frequency of the receiver clock by the frequency offset associated with the time reference.

6. The method as in claim 5, wherein the step of modifying the frequency of the receiver clock is based in part on an equation:

$$f_r(T) = f_r(T-1) + \Delta f(T)$$

where $f_r(T)$ represents the frequency of the receiver clock after modification, $f_r(T-1)$ represents the frequency of the receiver clock prior to modification, and $\Delta f(T)$ represents the frequency offset.

7. The method as in claim 1, wherein the transmitter and receiver are part of a packet-switched network, and wherein the sequence of time references include a sequence of timestamps transmitted from the transmitter to the receiver as packets over the packet-switched network.

8. A computer signal embodied in a carrier wave readable by a computing system and encoding a computer program of instructions for executing a computer process for performing the method recited as in claim 1.

9. A phase-locked loop (PLL) for synchronizing a local clock to a reference clock, the PLL comprising:

an oscillator being adapted to output a local frequency;

a loop filter being adapted to:

for each time reference of a sequence of time references of the reference clock:

determine a first-order smoothing value based in part on a weighted average of a previous first-order smoothing value associated with a previously received time reference of the sequence and a difference between the time reference and a corresponding time reference of the local clock;

determine a second-order smoothing value based in part on a weighted average of the first-order smoothing value and a previous second-order smoothing value associated with the previously received packet; and determine a frequency offset based in part on a difference between the first-order smoothing value and the second-order smoothing value; and an oscillator input conditioner operably connected to the loop filter and the oscillator and being adapted to modify the local frequency of the oscillator by the frequency offset.

10. The PLL as in claim 9, further comprising:

a counter operably connected to the oscillator and being adapted to convert the local frequency into a local clock reference; and a phase detector operably connected to the loop filter and the counter and being adapted to determine, for each time reference of the sequence, a clock error based in part on a difference between the time reference and a corresponding time reference of the counter.

11. The PLL as in claim 9, wherein the loop filter is adapted to determine the first-order smoothing value based in part on an equation:

$$S_s(T)=\alpha x(T)+(1-\alpha)S_s(T-1)$$

where $S_s(T)$ represents a first-order smoothing value associated with a time reference received at time T, $x(T)$ represents a clock error between the transmitter clock and the receiver clock associated with the time reference received at time T, $S_s(T-1)$ represents a first-order smoothing value associated with a previous time reference received at time T−1 previous to time T, and $\alpha$ represents a real-value weighting factor between zero and one.

12. The PLL as in claim 9, wherein the loop filter is adapted to determine the second-order smoothing value is based in part on an equation:

$$S_D(T)=\alpha S_s(T)+(1-\alpha)S_D(T-1)$$

where $S_D(T)$ represents a second-order smoothing value associated with a time reference received at time T, $S_D(T-1)$ represents a second-order smoothing value associated with a previous time reference received at time T−1 previous to time T, $S_s(T)$ represents a first-order smoothing value associated with the time reference received at time T, and $\alpha$ represents a real-value weighting factor between zero and one.

13. The PLL as in claim 9, wherein the loop filter is adapted to determine the frequency offset based in part on an equation:

$$\Delta f(T) = \frac{\alpha}{1-\alpha}[S_S(T) - S_D(T)]$$

where $\Delta f(T)$ represents the frequency offset associated with a time reference received at time T, $S_D(T)$ represents a second-order smoothing value associated with the time reference, $S_s(T)$ represents a first-order smoothing value associated with the time reference, and $\alpha$ represents a real-value weighting factor between zero and one.

14. The PLL as in claim 9, wherein the oscillator input conditioner is adapted to modify the frequency of the oscillator by the frequency offset based in part on an equation:

$$f_r(T)=f_r(T-1)+\Delta f(T)$$

where $f_r(T)$ represents the frequency of the receiver clock after modification, $f_r(T-1)$ represents the frequency of the receiver clock prior to modification, and $\Delta f(T)$ represents the frequency offset.

15. The PLL as in claim 9, wherein the reference clock is a clock of a transmitter and the local clock is a clock of a receiver in a packet-switched network, and wherein the sequence of time references include a sequence of timestamps transmitted from the transmitter to the receiver as packets over the packet-switched network.

16. In a packet-switched network, a system for playout of data of a sequence of packets transmitted from a transmitter, the system comprising:
    a data buffer being adapted to store a data payload of each packet of the sequence of packets;
    a timestamp buffer being adapted to store a transmitter timestamp of each packet of the sequence of packets, the transmitter timestamp being representative of a time of a clock of the transmitter at a transmission of the packet;
    a playout module operably connected to the data buffer and the timestamp buffer and being adapted to direct an output of a data payload from the data buffer when a corresponding transmitter timestamp in the timestamp buffer is equivalent to a time of a local clock; and
    a phased-lock loop (PLL) being adapted to provide the local clock and being further adapted to:
        for each packet of the sequence of packets:
            determine a first-order smoothing value based in part on a weighted average of a clock error between the local clock and the transmitter clock and a previous first-order smoothing value associated with a previously received packet of the sequence;
            determine a second-order smoothing value based in part on a weighted average of the first-order smoothing value and a second-order smoothing value associated with the previously received packet; and
            modify a frequency of the local clock by a frequency offset based in part on a difference between the first-order smoothing value and the second-order smoothing value.

17. The system as in claim 16, wherein the PLL is adapted to determine the first-order smoothing value based in part on an equation:

$$S_s(T)=\alpha x(T)+(1-\alpha)S_s(T-1)$$

where $S_s(T)$ represents a first-order smoothing value associated with a time stamp received at time T, $x(T)$ represents a clock error between the transmitter clock and the local clock associated with the timestamp received at time T, $S_s(T-1)$ represents a first-order smoothing value associated with a previous timestamp received at time T−1 previous to time T, and $\alpha$ represents a real-value weighting factor between zero and one.

18. The system as in claim 16, wherein the PLL is adapted to determine the second-order smoothing value is based in part on an equation:

$$S_D(T)=\alpha S_s(T)+(1-\alpha)S_D(T-1)$$

where $S_D(T)$ represents a second-order smoothing value associated with a timestamp received at time T, $S_D(T-1)$ represents a second-order smoothing value associated with a previous timestamp received at time T−1 previous to time T, $S_s(T)$ represents a first-order smoothing value associated with the timestamp received at time T, and $\alpha$ represents a real-value weighting factor between zero and one.

19. The system as in claim 16, wherein the PLL is further adapted to determine the frequency offset based in part on an equation:

$$\Delta f(T) = \frac{\alpha}{1-\alpha}[S_S(T) - S_D(T)]$$

where $\Delta f(T)$ represents the frequency offset associated with a timestamp received at time T, $S_D(T)$ represents a second-order smoothing value associated with the timestamp, $S_s(T)$ represents a first-order smoothing value associated with the timestamp, and $\alpha$ represents a real-value weighting factor between zero and one.

20. The system as in claim 16, wherein the PLL is adapted to modify the frequency of local clock based in part on an equation:

$$f_r(T)=f_r(T-1)+\Delta f(T)$$

where $f_r(T)$ represents the frequency of the local clock after modification, $f_r(T-1)$ represents the frequency of the local clock prior to modification, and $\Delta f(T)$ represents the frequency offset.

* * * * *